US006407688B1

(12) United States Patent
Greig

(10) Patent No.: US 6,407,688 B1
(45) Date of Patent: Jun. 18, 2002

(54) CMOS DAC WITH HIGH IMPEDANCE DIFFERENTIAL CURRENT DRIVERS

(75) Inventor: David Vetea Greig, Pasadena, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 09/837,928

(22) Filed: Apr. 19, 2001

Related U.S. Application Data

(63) Continuation of application No. 09/383,068, filed on Aug. 25, 1999, now Pat. No. 6,295,012.

(51) Int. Cl.[7] .................................................. H03M 1/66

(52) U.S. Cl. ...................... 341/136; 341/133; 341/144; 323/315

(58) Field of Search ................................. 341/136, 144, 341/133; 323/315

(56) References Cited

U.S. PATENT DOCUMENTS

| | | | |
|---|---|---|---|
| 5,696,512 A | 12/1997 | Takiguchi | 341/144 |
| 5,815,103 A | 9/1998 | Comminges et al. | 341/144 |
| 6,100,830 A | 8/2000 | Dedic | 341/136 |

OTHER PUBLICATIONS

Boiocchi, S. et al. Self–Calibration in high speed current steering CMOS D/A Converters, IEE 1994, Conference Pub.: Second International Conference on Advanced A–D and D–A Conversion Techniques and Their Applications, pp. 148–152.*

De Lima, J.A., On Optimizing Micropower MOS Regulated Cascode Circuits On Switched Current Techniques, Proceedings of the 1998 IEEE International Symposium on Circuits and Systems, IEEE, vol. 2, pp. 374–377.*

Park, J. et al., A 3V 10b 70 MHz Digital–to–Analog Converter for Video Applications, IEEE, 1999, First IEEE Asia Pacific Conference on ASICs p. 186–189.*

Takahiro Miki, Yasuyuki Nakamura, Maso Nakaya, Sotoju Asai, Yoichi Akasaka, and Yasutaka Horiba, "An 80–MHZ 8–bit CMOS D/A Converter", IEEE J. Solid–State Circuits, vol. SC–21, pp. 983–988, Dec. 1986.

E. Sackinger and W. Guggenbuhl, "A High–Swing, High Impedance MOS Cascode Circuit", IEEE J. Solid–State Circuits, vol. 25, No. 1, pp. 289–298, Feb. 1990.

Yasuyuki Nakamura, Takahiro Miki, Atsushi Maeda, Harufusa Kondoh, and Nobuharu Yasawa, "A 10–b 70–MS/s CMOS D/A Converter", IEEE J. Solid–State Circuits, vol. 32, No. 9, pp. 1465–1469, Sep. 1997.

(List continued on next page.)

*Primary Examiner*—Howard L. Williams
(74) *Attorney, Agent, or Firm*—Christie, Parker & Hale, LLP

(57) ABSTRACT

High-performance, digital-to-analog conversion (DAC) suitable for use in systems implemented with low-voltage, low-power integrated circuit fabrication processes is disclosed. Encoder circuitry receives a binary number for which an analog representation is sought. Segments of the binary number are thermometer encoded and complemented to provide signals to drive analog conversion circuitry. The analog conversion circuitry includes sets of current cells, with each cell in a set contributing an equal amount to one or the other of the complementary legs of the analog output of the converter. Each current cell is a fully differential current switch with charge canceling, fed by a regulated cascode current source. The regulated cascode current source offers uncharacteristically high impedance that contributes to good circuit performance even in low-voltage, low-power implementations. Other design factors of the current cell contribute significantly to overall performance. Hierarchical gradient symmetry cancellation techniques are also employed to reduce integral non-linearity attributable to process-related surface gradients.

7 Claims, 4 Drawing Sheets

Bruce J. Tesch and Juan C. Garcia, "A Low Glitch 14–b 1(
MHz D/A Converter", IEEE J. Solid–State Circuits, vol. 3:
No. 9, pp. 1465–1469, Sep. 1997.
Behzad Razavi, "Principles of Data Conversion System
Design", pp. vii–xiii, 79–95, IEEE Press, New Jersey, 199.
Tan, A, "1.4–V 3–mW 10–bit 50Ms/s CMOS DAC with
Low Distortion and Low Intermodulation in Standard Digi
tal CMOS Process", IEEE 1997 Custom Integrated Circuit
Conference, pp. 599–602.
Park et al, "A 3 v 10b 70 MHz Digital–to–Analog Convert
for Video Applications", IEEE Asia Pacific Conference on
ASICs, Aug. 1999, pp. 186–189.
* cited by examiner

Current Cell Switching Order

MSB Matrix 170

| 46 | 42 | 41 | 45 | 47 | 43 | 44 | 48 |
|----|----|----|----|----|----|----|----|
| 14 | 10 | 9  | 13 | 15 | 11 | 12 | 16 |
| 6  | 2  | 1  | 5  | 7  | 3  | 4  | 8  |
| 38 | 34 | 33 | 37 | 39 | 35 | 36 | 40 |
| 54 | 50 | 49 | 53 | 55 | 51 | 52 | 56 |
| 22 | 18 | 17 | 21 | 23 | 19 | 20 | 24 |
| 30 | 26 | 25 | 29 | 31 | 27 | 28 | 32 |
| 62 | 58 | 57 | 61 | 63 | 59 | 60 | 64 — 410 or dummy |

LSB Matrix 172

| 14 | 10 | 9 | 13 | 15 | 11 | 12 | 16 |
|----|----|---|----|----|----|----|----|
| 6  | 2  | 1 | 5  | 7  | 3  | 4  | 8 — 412 |

*Figure 4*

CMOS DAC WITH HIGH IMPEDANCE DIFFERENTIAL CURRENT DRIVERS

CROSS REFERENCE TO RELATED APPLICATIONS

This application is a continuation of application Ser. No. 09/383,068, Filed Aug. 25, 1999, now issued as U.S. Pat. No. 6,295,012, the disclosure of which is incorporated fully herein by reference.

BACKGROUND OF THE INVENTION

1. Field of the Invention

The invention relates to electronic devices and in particular, to those employing digital-to-analog conversion circuitry.

2. Description of Related Art

Modern electronic systems are typically realized as a complete "system on a chip." Such systems typically integrate analog and digital functionality onto the die of a single integrated circuit. Such systems offer lower cost, power, and size benefits to the customer.

Often a system will be based on a digital signal processing (DSP) core that implements system functionality through the use of discrete mathematical algorithms that are realized through hardware, firmware, or programmable means. In order for the system to interface to analog based continuous signals, such systems typically employ the use of a digital-to-analog converter (DAC). Examples of such systems include direct digital synthesis (DDS) products, TDMA/CDMA wireless communication systems, as well as audio and video devices.

CMOS continues to be the dominant process used to fabricate integrated circuits that contain such systems-on-a-chip. Driven by the desire for further miniaturization, advances in CMOS fabrication processes continue to lead to integrated circuits with lower and lower operating voltage and power specifications. While digital circuit designs can readily be transported to a more advanced process, analog circuit designs often produce poorer results when transported, or cannot be transported at all.

Traditional circuit designs for digital-to-analog converters suffer in this respect and generally perform poorly when moved to advanced CMOS fabrication processes. Consequently, there is a need in the art for a digital-to-analog converter providing both good AC and DC performance characteristics, and occupying minimal die space, when implemented using advanced integrated circuit fabrication processes.

SUMMARY OF THE INVENTION

The invention may be employed to provide high-performance digital-to-analog conversion suitable for use in systems implemented with low-voltage, low-power integrated circuit fabrication processes. The digital-to-analog converter embodiment described herein includes encoder circuitry and analog conversion circuitry. The encoder circuitry receives a binary number for which an analog representation is sought. Segments of the binary number each feed into a binary-to-thermometer encoder. Each binary-to-thermometer encoder turns on the number of output signals that corresponds to the value represented at its inputs. Latch elements latch the output signals of each binary-to-thermometer encoder, and present each signal and its complement as outputs to the analog conversion circuitry.

The analog conversion circuitry includes a set of current switching cells for each segment of the binary number fed to a binary-to-thermometer encoder. Each cell in a set contributes an equal amount to the analog output of the converter. Each cell is controlled by one of the output signals of the encoder circuitry latches and its complement, to contribute its total weight to one or the other of the complementary outputs of the converter.

Each current cell is a fully differential current switch with charge canceling, fed by a regulated cascode current source. The regulated cascode current source receives its input current from a master current bias circuit through a pair of mirror transistors. The regulated cascode current source offers uncharacteristically high impedance that contributes to good circuit performance even in low-voltage, low-power implementations. Other design factors of the current cell contribute significantly to overall performance.

Hierarchical gradient symmetry cancellation techniques are employed to assign switching order assignments to the cells within each set in order to reduce integral non-linearity attributable to process-related surface gradients.

These and other purposes and advantages of the present invention will become more apparent to those skilled in the art from the following detailed description in conjunction with the appended drawings.

BRIEF DESCRIPTION OF THE DRAWINGS

FIG. 4 illustrates the layout orientation of current cell matrices and the relative switching order among the cells in each matrix.

In the figures just described, like parts appearing in multiple figures are numbered the same in each figure.

DETAILED DESCRIPTION

The present invention provides improved circuit design for electronic devices requiring low-voltage digital-to-analog conversion. In the following description, numerous details are set forth in order to enable a thorough understanding of the present invention. Many such details relate to an embodiment of the present invention using a 3.3 Volt CMOS fabrication process to implement digital-to-analog conversion for a 10-bit binary value. However, it will be understood by those of ordinary skill in the art that these specific details are not required in order to practice the invention. Further, well-known elements, devices, process steps and the like are not set forth in detail in order to avoid obscuring the present invention.

Figure 1:
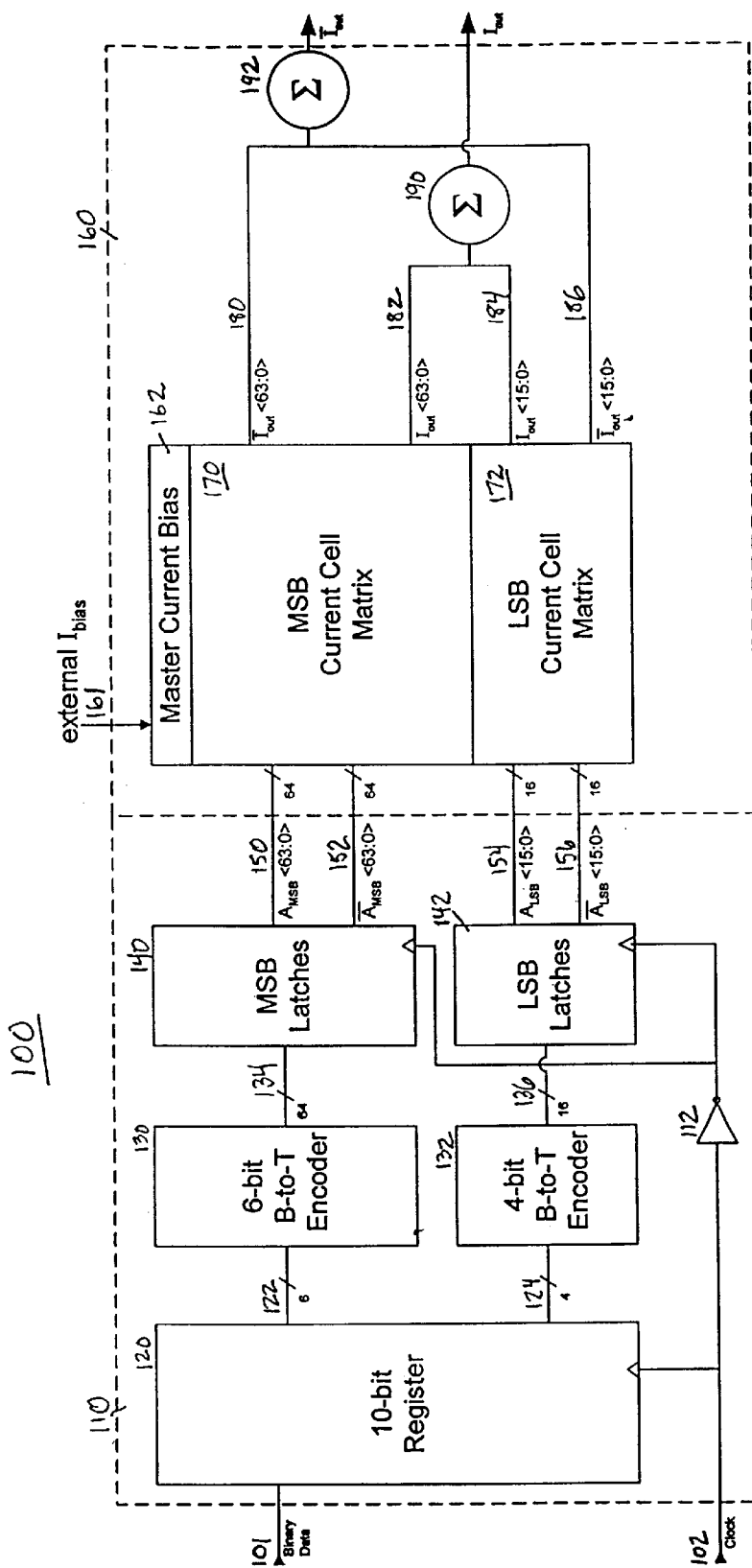
FIG. 1 is a block diagram of a digital-to-analog converter.

FIG. 1 is a block diagram of a digital-to-analog converter (DAC). Digital-to-analog converter 100 comprises encoder circuitry 110, and analog conversion circuitry 160. Encoder circuitry 110 further comprises data register 120, binary-to-thermometer encoders 130, 132, latches 140, 142, inverter 112, and interconnecting signal pathways 122, 124, 134, 136, 150, 152, 154, 156. Analog conversion circuitry 160 further comprises external bias current connection 161, master current bias circuitry 162, current cell matrices 170, 172, signal pathways 180, 182, 184, 186, and current summing nodes 190, 192.

ENCODER CIRCUITRY

Encoder circuitry 110 functions to receive a binary number at its input 101 and to present complementary signal pairs at its outputs 150–156 that are representative of the received binary number. The binary number is the digital value for which the DAC is to produce an analog counterpart. The complementary pairs will be used by the analog conversion circuitry to turn on and off individual cells that contribute to the complementary analog output of the DAC.

Operation of the various circuit elements within encoder circuitry 110 are synchronized by means of a clock signal presented at input 102. Data register 120 temporarily stores the incoming binary number at the rising edge of the clock signal. In the presently described embodiment, data register 120 is a 10-bit register, permitting the binary number to have a maximum value of $2^{10}-1$, or 1023 (i.e., 1024 possible values including zero).

Upon storage by the data register 120, the 10 bits representing the binary number are communicated over signal pathways 122, 124 to binary-to-thermometer encoders 130, 132. Binary-to-thermometer encoders 130, 132 are also referred to as unit encoders, herein. Each unit encoder operates such that the number of bits turned on at its output is the same as the numeric value presented at its input. The numeric value presented at its multi-bit input is presumed to be a binary number. A binary number has a least significant bit with a unit value (i.e., $2^0=1$), and each successive bit represents twice the numeric value of the preceding bit. When the number is unit coded all bits share the same significance, i.e., the unit value.

A least significant segment of the binary number stored in register 120, comprising the four least significant bits (LSB), are communicated to LSB unit encoder 132 over signal pathway 124. Signal pathway 124 communicates four bits in parallel. LSB unit encoder 132 converts the 4-bit input to a 16-bit ($2^4=16$), unit coded output. Note that one of the 16 output bits will always be in the off state and is included for design convenience. While the 4-bit input can represent 16 possible values, one of those values is zero. Accordingly, the highest numeric value that can be represented is 15, so at most 15 unit coded outputs will be in the on state.

A most significant segment of the binary number stored in register 120, comprising the six most significant bits (MSB), are communicated to MSB unit encoder 130 over signal pathway 122. Signal pathway 122 communicates six bits in parallel. MSB unit encoder 130 converts the 6-bit input to a 64-bit ($2^6=64$), unit coded output. Note that one of the 64 output bits will always be in the off state and is included for design convenience. While the 6-bit input can represent 64 possible values, one of those values is zero. Accordingly, the highest numeric value that can be represented is 63, so at most 63 unit coded outputs will be in the on state.

Each of unit encoders 130, 132 performs and completes the encoding operation during the "on" state of the master clock signal that first triggered the storage of a binary number in register 120. Completion of the encoding operation includes presenting outputs in a settled and static state. In the described embodiment, unit encoders 130, 132 were coded in the Verilog programming language and synthesized into transistor-based hardware.

Unit encoder 130 communicates its output to MSB latch circuitry 140 over 10 signal pathway 134. Signal pathway 134 communicates 64 bits in parallel. Unit encoder 132 communicates its output to LSB latch circuitry 142 over signal pathway 136. Signal pathway 136 communicates 16 bits in parallel.

MSB latch circuitry 140 and LSB latch circuitry 142 function as "slave" registers. The clock signal that drives these registers is an inverted version of the master clock signal that drives register 120. The inversion of the master clock signal is implemented through simple inverter 112. MSB latch circuitry 140 and LSB latch circuitry 142 store their input signals communicated over signal pathways 134 and 136, respectively, on the rising edge of the inverted master clock signal. The MSB 140 and LSB 142 latch circuitry present stable output values to analog conversion circuitry 160 for a first binary number during the time a second binary number is being stored by register 120 and encoded by unit encoders 130, 132.

The MSB 140 and LSB 142 latch circuitry further produce a complementary pair of outputs for each bit of their inputs. The first output signal of the complementary pair is identical in value to the corresponding input bit. The second output signal of the complementary pair is the complement, or inverse, of the value of the corresponding input bit. MSB latch circuitry 140 communicates the non-inverted signals of the complementary pairs on signal pathway 150, and the inverted signals of the complementary pairs on signal pathway 152, to the MSB current cell matrix 170. LSB latch circuitry 142 communicates the non-inverted signals of the complementary pairs on signal pathway 154, and the inverted signals of the complementary pairs on signal pathway 156, to the LSB current cell matrix 172.

One complementary output pair of MSB latch circuitry 140 corresponds to the single bit in the output of MSB unit encoder 130 that is always in the off state as described earlier. Similarly, one complementary output pair of LSB latch circuitry 142 corresponds to the single bit in the output of LSB unit encoder 132 that is always in the off state. In some embodiments such an output pair corresponding to an always-off input is not communicated to the analog conversion circuitry. Other embodiments may communicate such an output pair to the analog conversion circuitry in modified form; i.e., the outputs are not complementary but are both fixed in the off state. One skilled in the art recognizes that these and other embodiments may be employed in the practice of the invention.

ANALOG CONVERSION CIRCUITRY

The analog conversion circuitry 160 prominently contains a plurality of current cells. Differential outputs from each of the current cells are summed at current summing nodes 190, 192, and drive a pair of load resistors that are centered at ground (not shown). The current driving the load resistors is related to the full-scale current in almost identical proportion as the original binary number relates to the maximum binary number the DAC 100 accommodates, i.e., 1023. Thus, the current represents an analog approximation of the original number in binary (digital) form.

Figure 2:
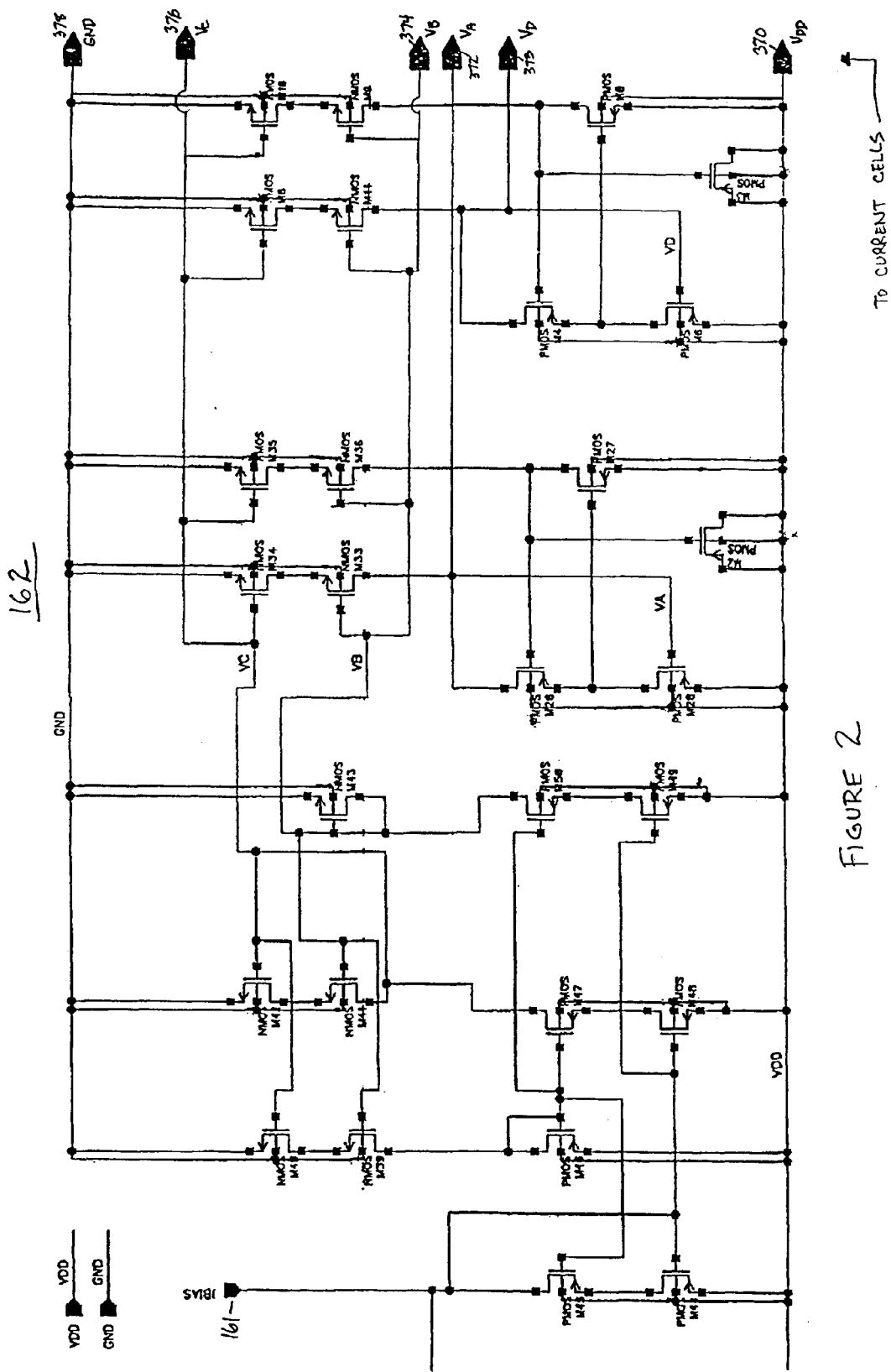
FIG. 2 is a schematic diagram of a master current bias circuit.

The individual current cells obtain current from master current bias circuit 162. FIG. 2 is a schematic diagram of the master current bias circuit used in the present embodiment. The master current bias circuit 162 uses a pair of low voltage, wide swing, high impedance current mirrors. The mirrors receive current from some stable current source at the external current bias connection point 161. The stable current source may be, for example, a bandgap reference current tap. The mirrors take in the current source and translate it to a current sink for use by the individual current cells. The current mirror and the bandgap reference current tap are well known in the art.

The presently described embodiment organizes the plurality of current cells into two sets of current cells, each physically configured as a matrix. MSB current cell matrix 170 is controlled by the complementary output signal pairs of MSB latch circuitry 140. LSB current cell matrix 172 is controlled by the complementary output signal pairs of LSB latch circuitry 142.

The MSB current cell matrix 170 is a coarse conversion matrix. In the presently described embodiment the MSB matrix 170 is fabricated on an integrated circuit die in an eight column by eight row matrix configuration, providing 64 cells. One sixty-fourth ($\frac{1}{64}=\frac{1}{2}^6$) of the nominal full-scale DAC output current is distributed equally to each of 63 of the 64 current cells in MSB matrix 170. One of the 64 current cells remains unused. The unused one sixty-fourth of the full-scale current supplies all of the current cells in the LSB current cell matrix 172. The full-scale current of the present embodiment is on the order of 20 milliamps.

Each of the cells is controlled by one of the complementary output signal pairs of MSB latch circuitry 140 to deliver its portion of the full-scale current to one or the other of the current summing nodes 190, 192 at the output of the DAC 100. An exception in the present embodiment is the unused current cell. Its control input signals are not complementary, but rather are both fixed in the off state. This prevents the cell from making a contribution to either summing node.

The LSB current cell matrix 172 is a fine conversion matrix. In the presently described embodiment the LSB matrix 172 is fabricated on an integrated circuit die in an eight row by two column matrix configuration, providing 16 cells. One sixteenth ($\frac{1}{16}=\frac{1}{2}^4$) of the one sixty-fourth of the nominal full-scale current unused by the MSB current cell matrix 170 is distributed equally to each of 15 of the 16 current cells in LSB matrix 172. One of the 16 current cells remains unused to accommodate a zero value. (The unused 1/1024 ($\frac{1}{2}^{4+6}$) of the nominal full-scale current remains unused resulting in an operational full-scale current just slightly below the nominal value.)

In similar fashion to the MSB cell matrix 170, each of the cells in the LSB current cell matrix 172 is controlled by one of the complementary output signal pairs of LSB latch circuitry 142 to deliver its portion of the full-scale current to one or the other of the current summing nodes 190, 192 at the output of the DAC 100. As above, an exception is the unused current cell. Its control input signals are not complementary, but rather are both fixed in the off state. This prevents the cell from making a contribution to either summing node.

Employing such equal current-based weighting to each current cell in a matrix provides faster settling time than with, for example, voltage divider DAC designs. This improves AC and DC performance and represents an advantage of the present invention.

CURRENT CELL DETAIL

Figure 3:
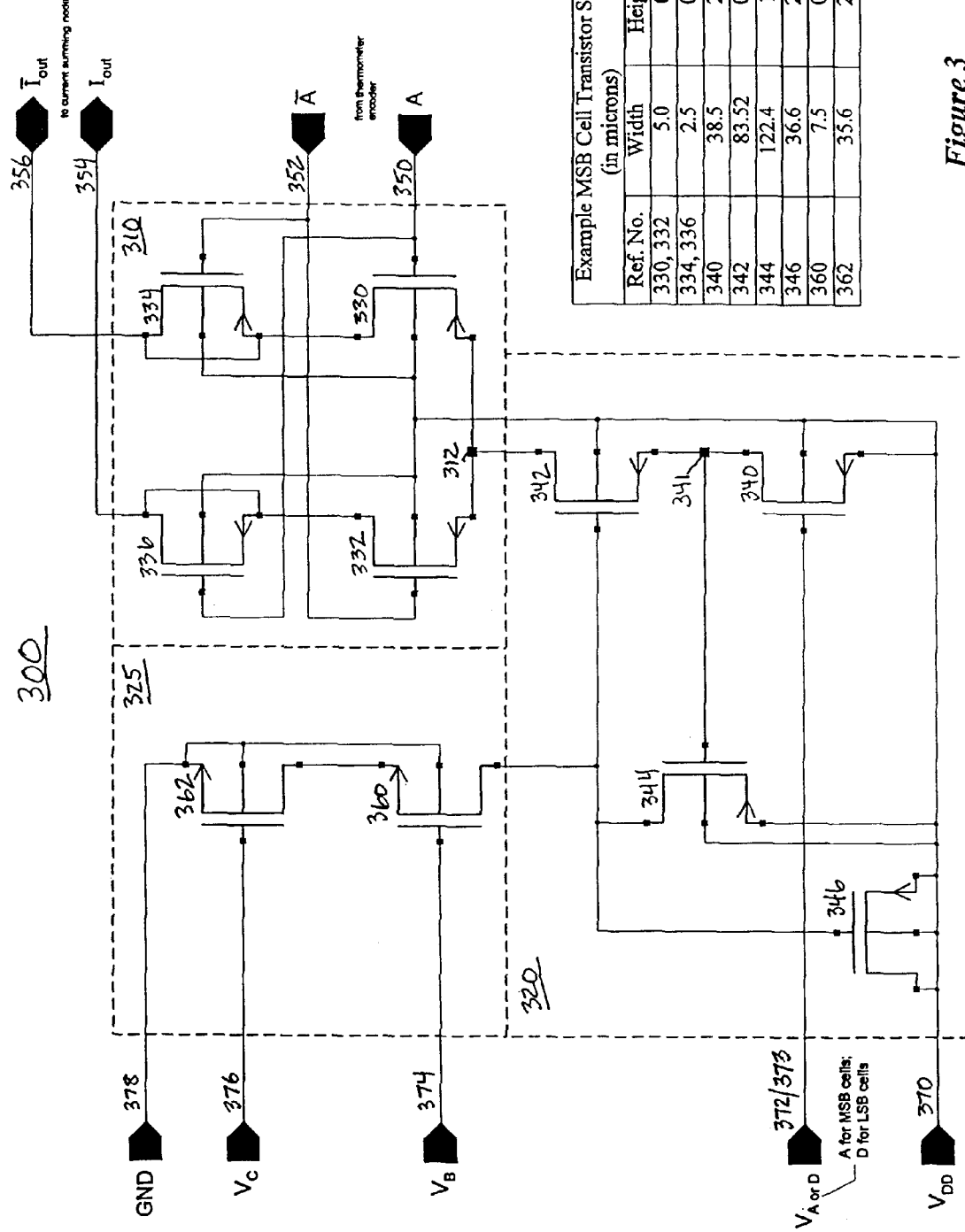
FIG. 3 is a schematic diagram of a current cell circuit.

FIG. 3 is a schematic diagram of a current cell circuit. The MSB matrix (170 of FIG. 1) and the LSB matrix (172 of FIG. 1) both employ the current cell architecture represented in the schematic for their individual current cells. Because a current cell in the MSB matrix 170 conducts some multiple of the current conducted by an LSB matrix 172 current cell, however, transistor sizes are scaled accordingly.

Each current cell 300 as depicted in FIG. 3 is a fully differential current switch, which takes in a pair of signals having complementary binary states, and passes a differential signal out to two loads having a common DC reference.

Each current cell 300 comprises a differential current switch circuit 310, a regulated cascode current source 320, a master current bias slave circuit 325, a DC reference voltage connection 370, inputs for a complementary signal pair 350, 352, differential outputs 354, 356, electrical ground connection 378, and master current bias connections 372, 374, 376. The differential current switch 310 further comprises current. source connection 312, switching transistors 330, 332, and charge canceling transistors 334, 336. The regulated cascode current source 320 further comprises cascode transistors 340, 342, DC bias node 341, impedance multiplier transistor 344, and capacitance element 346. The master current bias slave circuit 325 further comprises master current supply bias mirror transistors 360, 362.

Differential current switch 310 receives current from the regulated cascode current source 320 at current source connection 312. The source of each of PMOS switching transistors 330, 332 is connected to current source connection 312. The drain of switching transistor 330 is connected to the source of charge canceling transistor 334. The. source and drain of charge canceling transistor 334 are shortcircuited, and the drain is further connected to one of the differential outputs 356. Switching transistor 330 has its gate connected to an input 350 for one of the signals of a complementary pair. Charge canceling transistor 334, in contrast, has its gate connected to an input 352 for the complementary signal of the pair.

In similar, but complementary, fashion, the drain of switching transistor 332 is connected to the source of charge canceling transistor 336. The source and drain of charge canceling transistor 336 are short-circuited, and the drain is further connected to the remaining differential output 354. Switching transistor 332 has its gate connected to input 352 for one of the signals of the complementary pair. Charge canceling transistor 336 has its gate connected to an input 350 for the complementary signal of the pair.

Accordingly, it can be seen that the gates of the switching transistors 330, 332 are driven by complementary signals, as are the gates of the charge canceling transistors 334, 336.

Each of charge canceling transistors 334, 336 is roughly equal to one half the size of its corresponding switching transistor, i.e., 330, 332, respectively. The charge canceling transistors 334, 336 cancel unwanted channel charge injection and minimize unwanted clock feed-through from the gate stimulus, by canceling charges between the switch transistor and the complementarily switched charge canceling transistor. This configuration achieves minimal unwanted feed-through to the loads coupled to the differential outputs 354, 356. The reduced feed-through minimizes harmonic distortion, improving spurious free dynamic range (SFDR). This represents a further advantage of the present invention.

Regulated cascode current source 320 delivers current to the differential current switch 310 at current source connection 312. Regulated cascode current source 320 uses a very high impedance cascode configuration (e.g., 100 Megaohms) to source up to the full value of the current through either leg of the differential current switch 310 depending on the value of the complementary input code. The cascode configuration employs two series cascoded transistors 340, 342. The source of cascode transistor 340 is connected to a common DC reference voltage connection 370. The drain of cascode transistor 340 is connected to the source of cascode transistor 342 at DC bias node 341. The drain of cascode transistor 342 is connected to current source connection 312.

By utilizing a regulated cascode current source configuration the stacked transistor area can be kept smaller than with a conventional stacked cascode configuration, while still maintaining high output impedance. The smaller area also serves to impair either active switching signal from feeding through the drain-source path of the cascode transistor 342 and ultimately to DC bias node 341. This improves differential non-linearity (DNL) characteristics by reducing disturbance at DC bias node 341. This represents a further advantage of the present invention.

The DC bias node 341 at which both cascode transistors 340, 342 meet is connected to the gate of impedance multiplier transistor 344. The drain of transistor 344 is fed back to the gate of cascode transistor 342. The source of transistor 344 is connected to a common DC reference voltage connection 370.

Impedance multiplier transistor 344 operates to effectively multiply the high impedance of the cascode output by a factor of the gain of the transistor 344. Transistor 344 further adds an additional path for unwanted charge at connection 312 to travel, and so reduces unwanted signal injection to the common DC bias node 341. Capacitance element 346 is connected in parallel with impedance multiplier transistor 344, increasing transient stability while further minimizing unwanted signal feed-through to the DC bias node 341. So increasing the stability of common DC bias node 341 reduces glitch energy transferred to the loads coupled to the differential outputs 354, 356, again reducing harmonic distortion, and improving SFDR. These operational characteristics represent yet another advantage of the present invention.

Further, the higher impedance of the individual cells than seen in earlier DAC designs helps maintain a higher overall impedance as seen by the load when the differential outputs of all the current cells are connected in parallel to the current summing nodes. The higher impedance contributes to lower integral non-linearity (INL) characteristics, a further advantage of the present invention.

FIG. 4 illustrates the layout orientation of current cell matrices and the relative switching order among the cells in each matrix. As described earlier, the MSB current cell circuitry 170 is configured as a matrix of 8 rows by 8 columns. The number appearing within each cell of the MSB matrix 170 in FIG. 3 indicates the switching order of the cell. In accordance with the unit encoding described earlier in relation to the encoder circuitry (110 of FIG. 1), for any cell switched on within the MSB matrix 170, all other cells within the MSB matrix 170 having a switching order number lower than that of the switched on cell, will also be switched on. The complementary signal pairs communicated from encoder circuitry (110 of FIG. 1) via signal paths (150, 152 of FIG. 1) are connected to the individual current cells of MSB matrix 170 to produce the switching order depicted in FIG. 4. Cell 410 is the unused cell of the matrix 170 as described above in reference to FIG. 1.

The LSB current cell circuitry 172 is configured as a matrix of 8 rows by 2 columns. The number appearing within each cell of the LSB matrix 172 in FIG. 3, similarly, indicates the switching order of the cell. As with the MSB matrix 170, for any cell switched on within the LSB matrix 172, all other cells within the LSB matrix 172 having a switching order number lower than that of the switched on cell, will also be switched on. The complementary signal pairs communicated from encoder circuitry (110 of FIG. 1) via signal paths (154, 156 of FIG. 1) are connected to the individual current cells of LSB matrix 172 to produce the switching order depicted in FIG. 4. Cell 412 is the unused cell of the matrix 172 as described above in reference to FIG. 1.

The cell switching order assignments depicted in FIG. 4 utilize hierarchical gradient symmetry cancellation techniques. Such a layout orientation has the advantage of reducing INL attributable to process-related surface gradients. This represents a further advantage of the present invention.

Various modifications to the preferred embodiment can be made without departing from the spirit and scope of the invention. For example, the design could be extended or contracted to accommodate a binary input number having more or fewer than 10 bits. Thus, the foregoing description is not intended to limit the invention which is described in the appended claims in which:

What is claimed is:

1. A current cell circuit for us in digital-to-analog conversion, comprising:

a regulated cascode current source including a capacitance element and a DC bias node;

a master current bias slave including a pair of bias transistors connected in a mirror configuration; and a differential current switch coupled to the regulated cascode current source, having first and second inputs for receiving complementary input signals, first and second outputs for presenting differential output signals and a current source connection, wherein the capacitance element is configured to reduce unwanted signal feed-through at the DC bias node.

2. The current cell of claim 1 wherein the regulated cascode current source further comprises:

a first cascode transistor having its source coupled to a DC reference source; and a second cascode transistor having its source coupled to the drain of the first cascode transistor, and its drain coupled to the current source connection of the differential current switch.

3. The current cell of claim 2 further comprising an impedance multiplier including a transistor having its gate coupled to the drain of the first cascode transistor and the source of the second cascode transistor, and its drain coupled to the gate of the second cascode transistor.

4. The current cell of claim 3 wherein the source of the feedback transistor is coupled to the DC reference source.

5. The current cell of claim 1 wherein the differential current switch further comprises:

a first switch element disposed between the current source connection and the first output; and a second switch element disposed between the current source connection and the second output.

6. The current cell of claim 4 wherein the differential current switch further comprises:

a first switch element disposed between the current source connection and the first output; and a second switch element disposed between the current source connection and the second output.

7. A digital-to-analog converter circuit comprising:

encoder circuitry for producing a plurality of complementary pairs of single-bit outputs;

a master current supply including a pair of bias transistors connected in a mirror configuration;

a first current summing node;

a second current summing node;

a plurality of current cells, each current cell having:
a correspondence with one of the plurality of complementary pairs of single-bit outputs;

a regulated cascode current source coupled to the master current supply including a capacitance element and a DC bias node; and a differential current switch having a current source connection coupled to the regulated cascode current source, a first input coupled to the first single-bit output of the corresponding complementary pair, a second input coupled to the second single-bit output of the corresponding complementary pair, a first output coupled to the first current summing node, and a second output coupled to the second current summing node, wherein the capacitance element is configured to reduce unwanted signal feed-through at the DC bias node.

* * * * *